(12) United States Patent
Welch et al.

(10) Patent No.: US 6,734,473 B1
(45) Date of Patent: May 11, 2004

(54) METHOD OF INTEGRATED CIRCUIT CONSTRUCTION WITH PORT ALIGNMENT AND TIMING SIGNAL BUFFERING WITHIN A COMMON AREA

(75) Inventors: M. Jason Welch, Ft. Collins, CO (US); Paul D Nuber, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/491,900

(22) Filed: Jan. 27, 2000

(51) Int. Cl.⁷ .................. H01L 27/10; H01L 23/544
(52) U.S. Cl. .................. 257/208; 257/211; 257/797; 257/781; 257/750

(58) Field of Search ...................... 257/208, 209, 257/210, 211, 797, 758, 734, 750, 773, 776, 781; 327/565

(56) References Cited

U.S. PATENT DOCUMENTS 6,043,704 A * 3/2000 Yoshitake
6,140,686 A * 10/2000 Mizuno et al. ............. 257/369

* cited by examiner

*Primary Examiner*—Long Pham
*Assistant Examiner*—DiLinh Nguyen

(57) ABSTRACT

The present invention relates to a method of integrated circuit construction in which misaligned ports are linked via an alignment link made up of a wiring trace and signal buffer. The signal buffer and wiring trace are located within a common area of integrated circuit real estate.

13 Claims, 4 Drawing Sheets

METHOD OF INTEGRATED CIRCUIT CONSTRUCTION WITH PORT ALIGNMENT AND TIMING SIGNAL BUFFERING WITHIN A COMMON AREA

TECHNICAL FIELD

The present invention is generally related to an integrated circuit having provisions for aligning ports developed using different layout methodologies and, more particularly, to an integrated system and method for aligning ports and providing for signal buffering within a common area of integrated circuit real estate.

BACKGROUND OF THE INVENTION

It is common in integrated circuit design for various methodologies to be utilized in laying out the signal wiring, or routing, which forms signal paths for signals to travel. Unfortunately, because of the inherent differences in these methodologies, it is common for there to be resulting mismatches in port alignments. As a result, the ports on various blocks of circuitry on an integrated circuit may not precisely line up for easy and direct interconnection. Thus, efforts must be taken to provide for an interface to link the different pieces of circuitry, This typically entails additional wiring to link the mis-aligned ports.

In order to combat the degradation in signal quality due to long signal paths, it is common to buffer the signals in order to retain proper signal timing and amplitude. Buffering of signals has typically been carried out separately from providing for linking of mis-aligned ports. This has resulted in integrated circuit real estate being utilized separately for aligning mis-aligned ports and for providing for appropriate buffering. As integrated circuit real estate is typically at a premium, addressing these two issues separately has meant greater usage of integrated circuit real estate.

FIG. 1 illustrates an example of two sets of ports from separate blocks of circuitry on an integrated circuit 200. Here it can be seen that a first set of ports 10, 11, 12 and 13 are located in a one area 1 on the integrated circuit 200. A second set of ports 14, 15, 16 and 17 are provided in a separate area 2 of integrated circuit 200. It will be noted that ports 10 and 14 represent a signal path A; that ports 11 and 15 represent a signal path B; that ports 12 and 16 represent a signal path C and that ports 13 and 17 represent a signal path D. Axes 100, 101, 102 and 103 help to show that the above pairs of ports do not directly align with one another.

With reference to FIG. 2 one typical technique of aligning ports is shown. Here a linking area 25 is utilized wherein bridge traces 20, 21, 22 and 23 art used to connect a first set of ports (ports 10, 11, 12 and 13, respectively) with a second set of ports (ports 14, 15, 16 and 17 respectively), via wiring traces (30, 31, 32 and 33 respectively) and signal buffering blocks (40, 41 42 and 43 respectively) in common area 35. The use of linking area 25 to provide for bridging traces 20, 21, 22 and 23 separate from common area 35 requires consumption of integrated circuit real estate which could otherwise be devoted to other purposes. This is expensive and wasteful, particularly with complex integrated circuits in which thousands upon thousands of semiconductor gates are implemented on the integrated circuit.

Thus, a heretofore unaddressed need exists in the industry to address the aforementioned deficiencies and inadequacies.

SUMMARY OF THE INVENTION

The present invention provides an integrated system and method for aligning mis-aligned ports within an integrated circuit designed using various layout methodologies.

Briefly described, in architecture, the system can be implemented as follows. There is provided an output port for transmitting a signal to a second port. The second port is designed to receive the signal. There is provided an alignment link for electrically connecting the first port with the second port. The alignment link is made up of a signal buffer for buffering a signal traveling along the alignment link between the first port and the second port.

The present invention can also be viewed as providing a method for aligning ports in an integrated circuit In this regard, the method can be broadly summarized by the following steps: extending a first port from one area into a common area; extending a second port from another area into the common area; linking the first port to the second port within the common area via an alignment link composed of a wiring trace and a signal buffer.

Other features and advantages of the present invention will become apparent to one with skill in the art upon examination of the following drawings and detailed description. It is intended that all such additional features and advantages be included herein within the scope of the present invention.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding pants throughout the several views.

DETAILED DESCRIPTION

The present invention is directed to an integrated circuit wherein provisions for aligning ports developed using different layout methodologies share common areas of integrated circuit real estate with buffering circuitry used to buffer signals so as to prevent degradation of signal quality.

Figure 1:
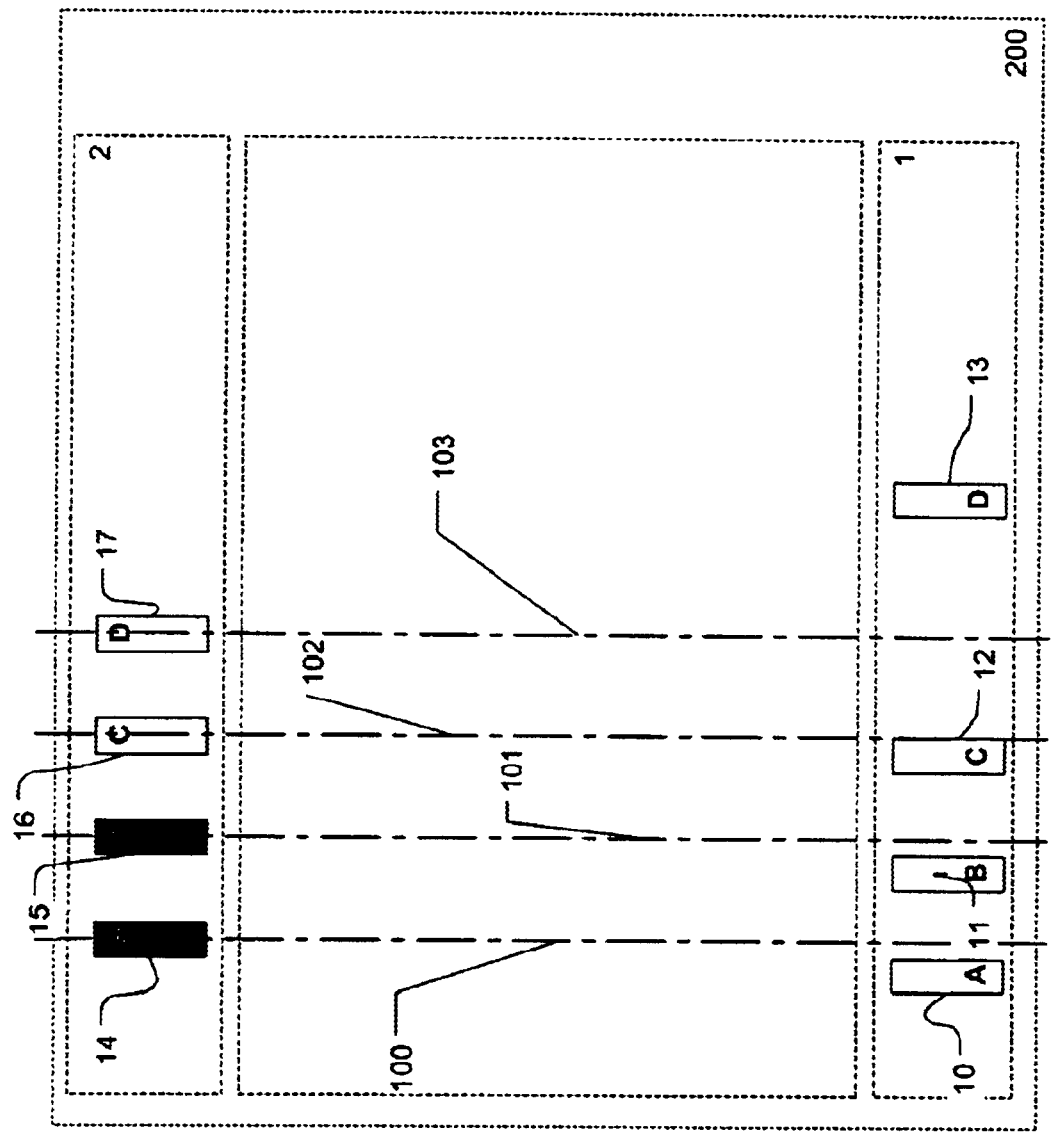
FIG. 1 is a diagram illustrating mis-aligned ports.
Figure 2:
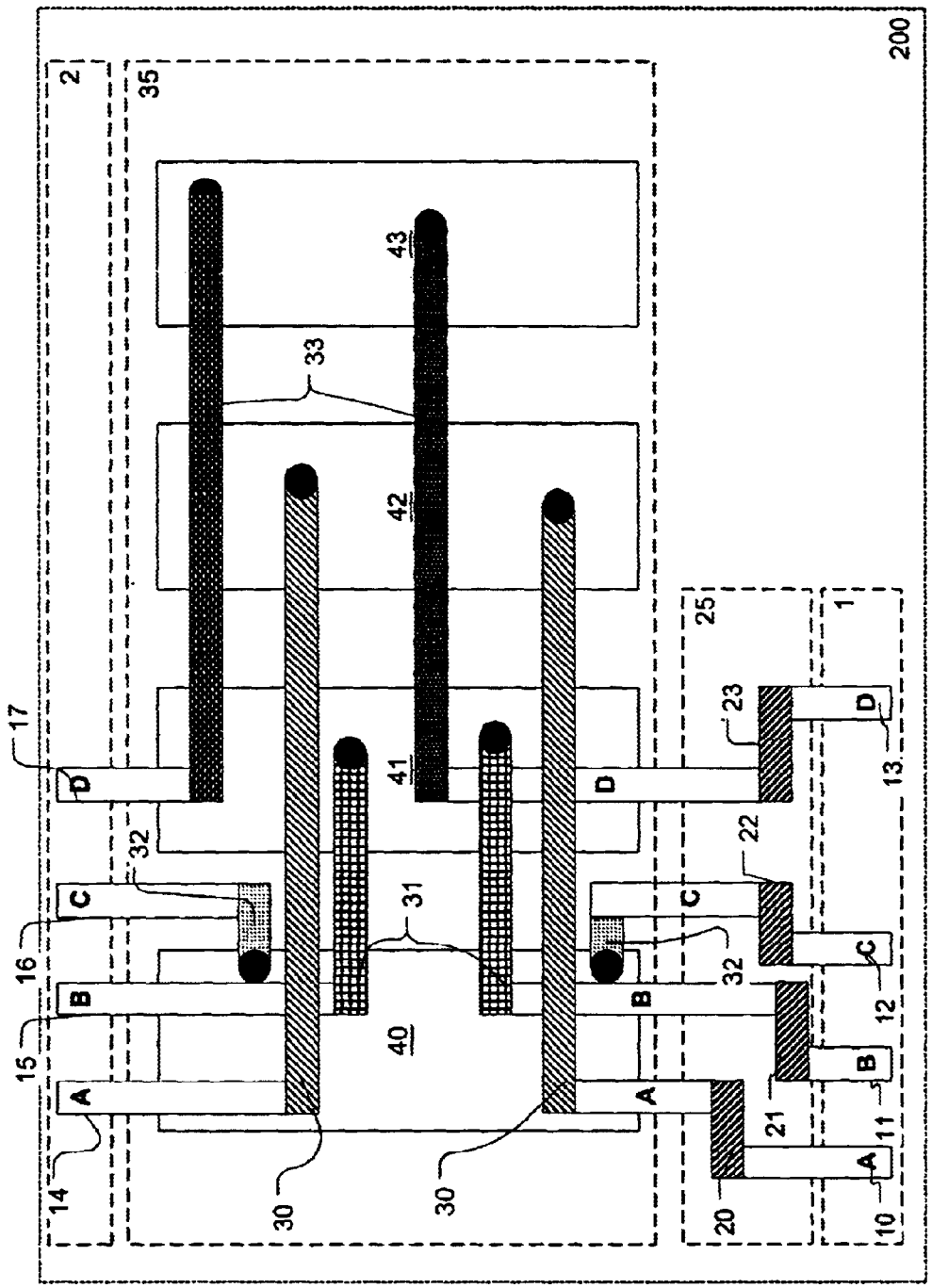
FIG. 2 is a diagram illustrating a typical technique of aligning mis-aligned ports.
Figure 3:
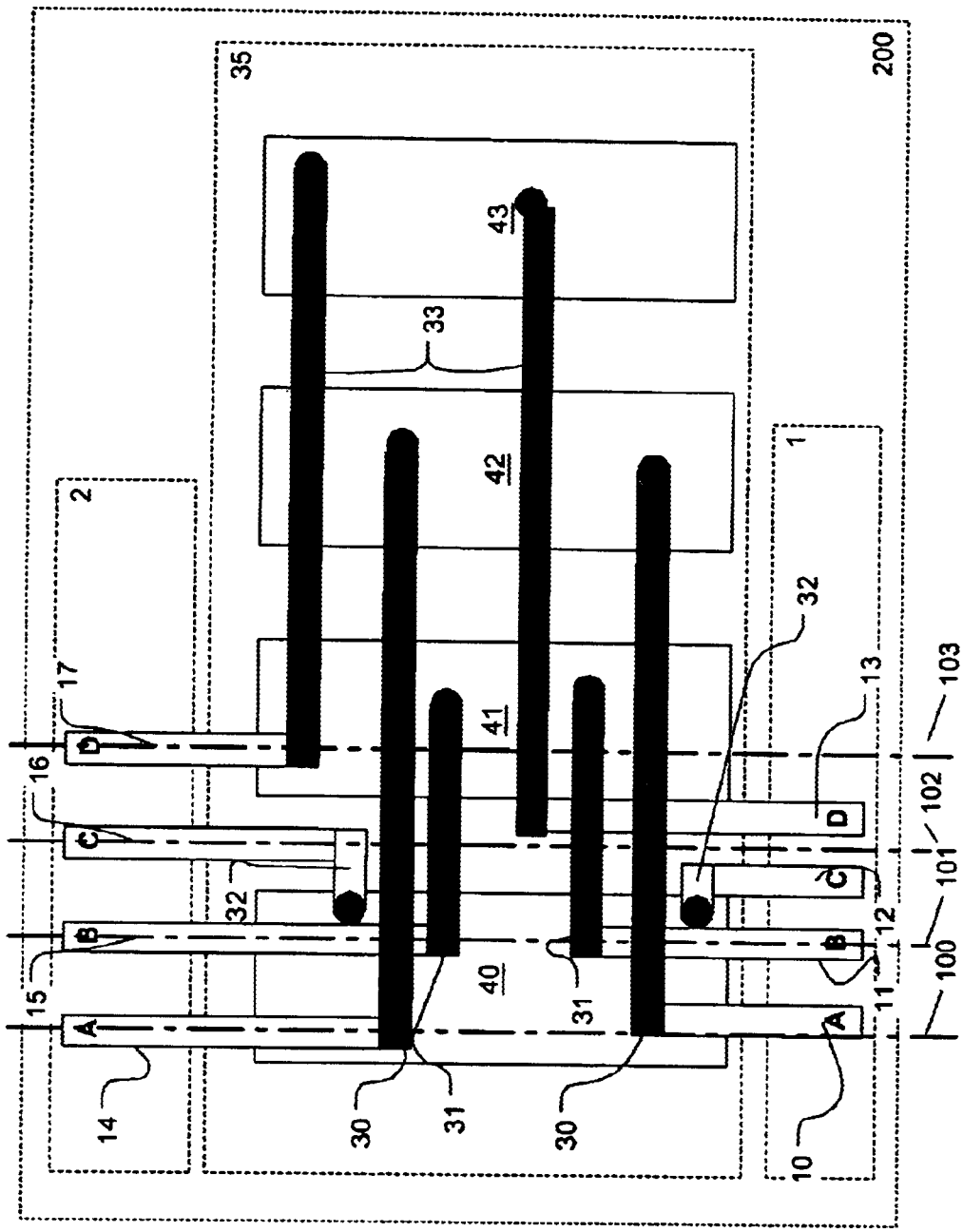
FIG. 3 is a diagram illustrating an integrated circuit in accordance with the present invention.

FIG. 3 illustrates an integrated circuit 200 in accordance with the present invention. As shown by FIG. 3, there is provided a common area 35, a first area 1 and a second area 2. Each of these areas represents separate non-overlapping areas of real estate on the integrated circuit. There are provided a set of output ports 10, 11, 12 and 13 in first area 1. These output ports represent outputs for one block of circuitry. A second set of ports 14, 15, 16 and 17 are provided in a second area 2. These ports represent input ports to a second block of circuitry on integrated circuit 200. It should be noted that output ports 10, 11, 12 and 13, as well as input ports 14, 15, 16 and 17 could be implemented as bi-directional bus connections. Output ports 10, 11, 12 and 13 are extended directly into common area 35. Common area 35 is a multilevel area of real estate in which signal buffering blocks 40, 41, 42 and 43 are provided on a semiconductor level, while wiring traces 30, 31, 32 and 33 are provided on a wiring level. Output ports 10, 11, 12 and 13 are each electrically connected to input ports 14, 15, 16 and 17, respectively, via an alignment link. This alignment link is made up of a wiring trace and a buffer block. More particularly, output ports 10, 11, 12 and 13 are connected via wiring traces 30, 31, 32 and 33, respectively and buffering blocks 40, 41, 42 and 43 respectively. In short, each alignment link is composed of a wiring trace and a buffering block, all of which are located within the common area 35. Common area 35 is preferably arranged so as to allow for placement of both wiring traces and buffering blocks (circuitry) within the common area, one on top of the other.

Buffering blocks 40, 41, 42 and 43 are designed to maintain the signal quality of the signal as it passes from the output ports 10, 11, 12 and 13 to the input ports 14, 15, 16 and 17 respectively. More particularly, signal timing accuracy is maintained by virtue of the signal buffering blocks 40, 41, 42 and 43. This is most important where output ports 10, 11, 12 and 13 are a substantial distance from ports 14, 15, 16 and 17 in relation to the overall circuit areas. A substantial distance in this context would typically be any distance which would negatively impact signal quality as it travels from one set of ports to the another and would typically be viewed by one skilled in the art as requiring buffering to avoid signal degradation.

Figure 4:
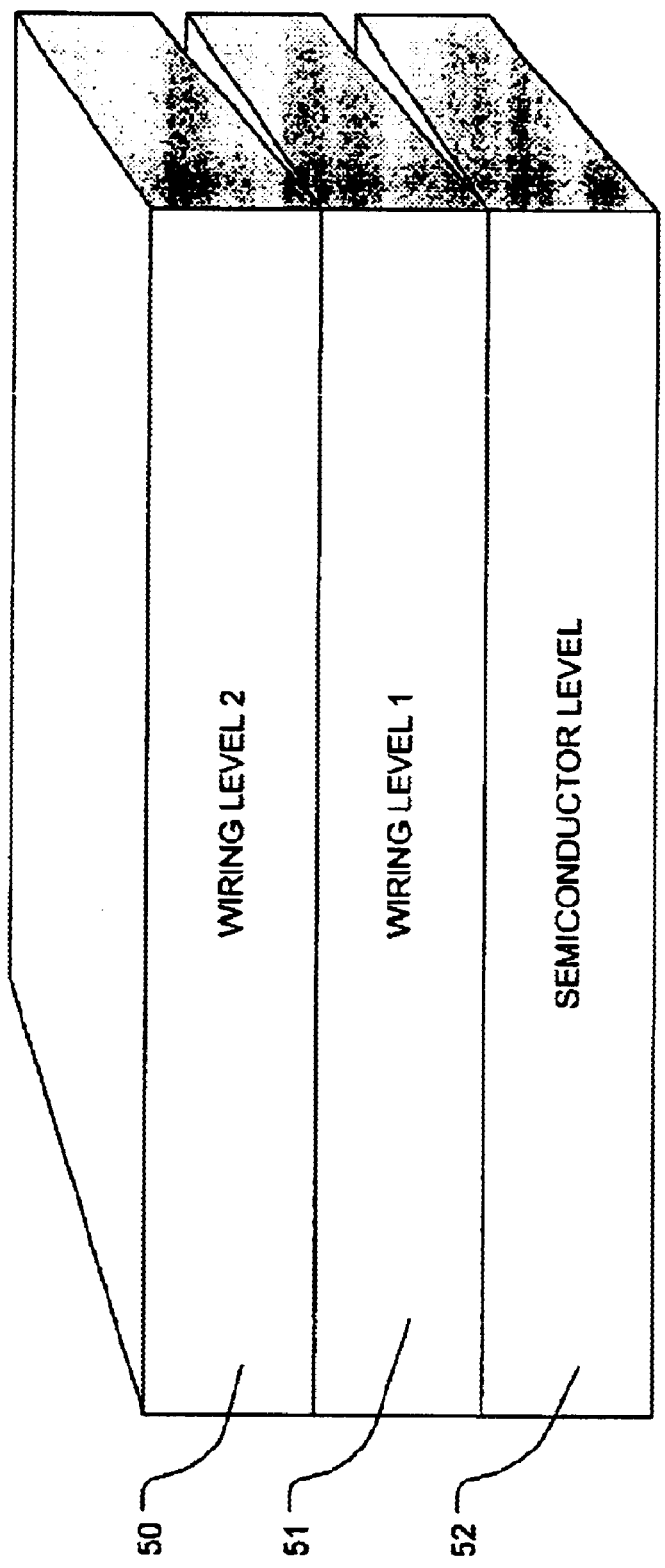
FIG. 4 is a diagram illustrating multiple-levels of integrated circuit real estate.

FIG. 4 illustrates integrated circuit real estate. Here there are shown multiple levels of real estate. There is provided semiconductor level 52 on which semiconductor features are located. There is also provided a wiring level 1 (51) and a wiring level 2 (50). Wiring traces are located on the wiring levels.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be in included herein within the scope of the present invention and protected by the following claims.

What is claimed:
1. An integrated circuit comprising:
   a first port for outputting a signal;
   a second port for receiving said signal;
   a common area comprising an alignment link for electrically connecting said first port with said second port;
   said first port is directly and electrically wired traced to said alignment link from a first area without the use of a first linking area that includes bridging traces for linking mis-aligned ports with said first port and said common area;
   said second port is directly and electrically connected to said alignment link from a second area without the use of a second linking area that includes bridging traces for linking mis-aligned ports with said second port and said common area; and
   said alignment link comprises a signal buffer for buffering a signal traveling along said alignment link between said first port and said second port; said alignment link is arranged within said common area.

2. An integrated circuit according to claim 1 wherein said alignment link further comprises a wiring trace.

3. An integrated circuit according to claim 1 wherein said first port is located in said first area of integrated circuit real estate.

4. An integrated circuit according to claim 1 wherein said second port is located in said second area of integrated circuit real estate.

5. An integrated circuit comprising:
   a first port located in a first area of integrated circuit real estate, for outputting a signal;
   a second port located in a second area of integrated circuit real estate, for receiving said signal;
   a common area comprising an alignment link for electrically connecting said first port with said second port;
   said first port is directly and electrically wired traced to said alignment link from a first area without the use of a first linking area that includes bridging traces for linking mis-aligned ports with said first port and said common area;
   said second port is directly and electrically connected to said alignment link from a second area without the use of a second linking area that includes bridging traces for linking mis-aligned ports with said second port and said common area;
   said alignment link comprises a signal buffer for buffering a signal traveling along said alignment link between said first port and said second port; and
   said integrated circuit real estate comprises multi-levels.

6. An integrated circuit according to claim 5 wherein said multi-levels comprise a semiconductor level and a wire tracing level.

7. An integrated circuit according to claim 6 wherein said semiconductor level comprises said signal buffer.

8. An integrated circuit according to claim 6 wherein said wire-tracing level comprises said first port and said second port.

9. An integrated circuit according to claim 8 wherein said wire-tracing level comprises a plurality of wire-tracing levels.

10. An integrated circuit comprising:
    a first port for outputting a signal;
    a second port for receiving said signal;
    a common area comprising an alignment means for electrically connecting said first port with said second port;
    said first port is directly and electrically wired traced to said alignment means from a first area without the use of a first linking area that includes bridging traces for linking mis-aligned ports with said first port and said common area; and
    said second port is directly and electrically connected to said alignment means from a second area without the use of a second linking area that includes bridging traces for linking mis-aligned ports with said second port and said common area.

11. An integrated circuit according to claim 10 wherein said alignment means comprises a wiring trace and a signal buffering circuitry.

12. An integrated circuit according to claim 10 wherein said first port and said second port are located at a substantial distance to each other relative to overall integrated circuit real estate.

13. A buffering circuitry with aligning ports that share a common area of integrated circuit real estate, said buffering circuitry comprising:

a first area arranged on a wiring level of said integrated circuit real estate, said first area includes a set of output ports;

a common area that is arranged in multilevel of said integrate circuit real estate, said common area includes signal buffering blocks provided on a semiconductor level, said common area also includes a first set and a second set of wiring traces provided in said wiring level, said common area is arranged to allow for placement of said first and second sets of wiring traces to be within said common area, wherein said set of output ports of said first area is directly and electrically connected to said first set of wiring traces of said signal buffering blocks without the use of a first linking area that includes bridge traces for linking misaligned ports with said first port and said common area; and a second area arranged on said wiring level of said integrated circuit real estate, said second area includes a set of input ports that is electrically connected to said second set of wiring traces of said signal buffering blocks without the use of a second linking area that includes bridge traces for linking mis-aligned ports with said second port and said common area.

* * * * *